(12) United States Patent
Griffin et al.

(10) Patent No.: US 9,268,003 B2
(45) Date of Patent: Feb. 23, 2016

(54) SYSTEM AND METHOD FOR MEASURING INDUCED RADIO FREQUENCY CURRENT USING PHASE CONTRAST MAGNETIC RESONANCE IMAGING

(71) Applicants: Gregory Huntindgon Griffin, Toronto (CA); Kevan Anderson, Oshawa (CA); Graham Wright, Toronto (CA)

(72) Inventors: Gregory Huntindgon Griffin, Toronto (CA); Kevan Anderson, Oshawa (CA); Graham Wright, Toronto (CA)

(73) Assignee: SUNNYBROOK HEALTH SCIENCES CENTRE, Toronto (CA)

( * ) Notice: Subject to any disclaimer, the term of this patent is extended or adjusted under 35 U.S.C. 154(b) by 389 days.

(21) Appl. No.: 13/766,457

(22) Filed: Feb. 13, 2013

(65) Prior Publication Data
US 2014/0225608 A1    Aug. 14, 2014

(51) Int. Cl.
*G01V 3/00*     (2006.01)
*G01R 33/48*   (2006.01)
*G01R 33/28*   (2006.01)

(52) U.S. Cl.
CPC .............. *G01R 33/48* (2013.01); *G01R 33/288* (2013.01)

(58) Field of Classification Search
CPC ....................................................... G01R 33/48
USPC ................................. 324/307, 309, 318, 322
See application file for complete search history.

(56) References Cited

U.S. PATENT DOCUMENTS

| | | | | |
|---|---|---|---|---|
| 4,910,460 | A * | 3/1990 | Sebok ........................... | 324/307 |
| 5,770,943 | A * | 6/1998 | Zhou ............................ | 324/307 |
| 6,448,773 | B1 * | 9/2002 | Zhang .......................... | 324/309 |
| 7,873,412 | B2 | 1/2011 | Wedan | |
| 2010/0179763 | A1 | 7/2010 | Overall et al. | |
| 2012/0139541 | A1 * | 6/2012 | Weiss et al. ................... | 324/318 |
| 2014/0232393 | A1 * | 8/2014 | Wheaton et al. .............. | 324/309 |

OTHER PUBLICATIONS

Bottomley, et al., Designing Passive MRI-Safe Implantable Conducting Leads With Electrodes, Medical Physics, 2010, 37(7):3828-3843.
Konings, et al., Heating Around Intravascular Guidewires by Resonating RF Waves, Journal of Magnetic Resonance Imaging, 2000, 12(1):79-85.
Ladd, et al., Reduction of Resonant RF Heating in Intravascular Catheters Using Coaxial Chokes, Magnetic Resonance in Medicine, 2000, 43(4):615-619.
Mattei, et al., Complexity of MRI Induced Heating on Metallic Leads: Experimental Measurements of 374 Configurations, BioMedical Engineering Online, 2008, 7(1):11, 16 pages.
Nitz, et al., On the Heating of Linear Conductive Structures as Guide Wires and Catheters in Interventional MRI, Journal of Magnetic Resonance Imaging, 2001, 13(1):105-114.

(Continued)

*Primary Examiner* — Louis Arana
(74) *Attorney, Agent, or Firm* — Quarles & Brady, LLP

(57) ABSTRACT

A method for automatically measuring currents induced on conducting structures positioned in the bore of a magnetic resonance imaging ("MRI") scanner using a single magnetic resonance image is provided. A conductive structure is positioned within the bore of the MRI scanner during imaging. When the MRI system is transmitting an RF field, a current is induced in the conductive structure. The current creates a magnetic field at the Larmor frequency, which couples to the RF magnetic field in the vicinity of the conductive structure. The modified magnetic field results in an artifact being generated in phase images. The artifact in the phase image is then analyzed to determine the current induced in the conductive structure.

23 Claims, 3 Drawing Sheets

(56) References Cited

OTHER PUBLICATIONS

Nordbeck, et al., Spatial Distribution of RF-Induced E-Fields and Implant Heating in MRI, Magnetic Resonance in Medicine, 2008, 60:312-319.

Nordbeck, et al., Measuring RF-Induced Currents Inside Implants: Impact of Device Configuration on MRI Safety of Cardiac Pacemaker Leads, Magnetic Resonance in Medicine, 2009, 61:570-578.

Nordbeck, et al., Impact of Imaging Landmark on the Risk of MRI-Related Heating Near Implanted Medical Devices Like Cardiac Pacemaker Leads, Magnetic Resonance in Medicine, 2011, 65:44-50.

Overall, et al., Ensuring Safety of Implanted Devices Under MRI Using Reversed RF Polarization, Magnetic Resonance in Medicine, 2010, 64(3):823-833.

Van Den Bosch, et al., New Method to Monitor RF Safety in MRI-Guided Interventions Based on RF Induced Image Artefacts, Medical Physics, 2010, 37(2):814-821.

Venook, et al., Monitoring Induced Currents on Long Conductive Structures During MRI, Proc. Intl. Soc. Mag. Reson. Med., 2008, 16:898.

Weiss, et al., Transmission Line for Improved RF Safety of Interventional Devices, Magnetic Resonance in Medicine, 2005, 54(1):182-189.

Zanchi, et al., An Optically-Coupled System for Quantitative Monitoring of MRI-Induced RF Currents Into Long Conductors, IEEE Trans. Med. Imaging, 2010, 29(1):169-178.

* cited by examiner

SYSTEM AND METHOD FOR MEASURING INDUCED RADIO FREQUENCY CURRENT USING PHASE CONTRAST MAGNETIC RESONANCE IMAGING

BACKGROUND OF THE INVENTION

The field of the invention is systems and methods for magnetic resonance imaging ("MRI"). More particularly, the invention relates to systems and methods for using MRI to measure induced radio frequency ("RF") currents.

In recent years, development of new MRI techniques for diagnosis and treatment monitoring and guidance, has motivated research into the safety of various electrically conductive devices undergoing MRI. Many implanted medical devices contain electrical conductors that currently contraindicate MRI exams. Furthermore, several interventions could benefit from catheter-based devices with electrical conductors running along their length. Unfortunately such devices, especially those with long linear conductors, have the potential to generate significant and unwanted temperature rises in surrounding tissue during MRI. Temperature increases near the catheter are caused indirectly by RF electrical current induced on the catheter wires by the transmit magnetic field, $B_1$. The heating characteristics of long conductive structures during MRI scanning have been extensively investigated; however, due to the complicated nature of RF heating there lacks a consensus on a generally applicable safety strategy.

Several groups are currently investigating various methods of improving the safety of catheter-based devices, many of which have been shown to effectively mitigate heating under specific circumstances. Generally, before a procedure the safety of a certain device and/or configuration is investigated in vitro using a fiber optic temperature probe. This test method, while accurate, has serious disadvantages. Firstly, testing different configurations requires lengthy repositioning and scanning. Secondly, the probe only measures temperature at one or a few isolated points, meaning that unexpected, dangerous hot spots may not be identified. Finally, this method is not applicable for in vivo applications because the temperature rise that must be induced would result in an unsafe condition for the subject.

To address the measurement duration and inapplicability in vivo, induced current can be measured, enabling a prediction of the specific absorption rate ("SAR") distribution near the conductor and subsequently the local heating behavior. The two main approaches towards induced RF current measurement are: direct sensing which involves a current transducer on or near the conducting wires; and remote sensing which uses image analysis to determine the current that was present during imaging. Most direct sensing devices suffer from the same limitation as the fiber-optic probe in that they can only measure current at one location. One toroidal current sensor has been developed which can easily be relocated; however, it is too big for in vivo applications, as is the case with all other direct measurement strategies.

The induced RF current flowing on the wire during MRI creates a magnetic field in the vicinity of the wire, at the Larmor frequency (excitation frequency of the magnetic field). This magnetic field couples to the transmit magnetic field, causing a noticeable artifact in both magnitude and phase MR images containing the wire.

One method of detecting induced RF currents on wires during MRI involves the use of reverse polarized transmission and/or reception of the MR signal. By transmitting and/or receiving with reverse polarization, the signal from the wire can be isolated from the forward polarized signal generated by surrounding anatomy. As a result, an image acquired in this manner would be black unless any current were flowing on the wire. This technique provides reliable detection of induced RF currents but has not been used for quantitative measurements. This qualitative technique would contradict some useful and safe exams because there exist situations in which currents could be qualitatively detected yet no risk of significant RF heating exists.

Another strategy of measuring induced RF currents is to analyze the artifact induced in the magnitude MR image. The spatial extent of the artifact is determined directly by the magnitude of induced RF current and thus it can be analyzed to measure current. However the magnitude method of remotely measuring induced current suffers from some limitations. Analyzing the magnitude artifact requires accurate $B_1$ maps acquired with several lengthy scans. Some of these scans require a large flip angle or long pulses and thus high RF power and a greater risk of inducing heating during measurement. Also, variations in signal magnitude due to sources other than the wire can be difficult to remove thereby resulting in inaccurate estimates of the induced current.

An image-based current measurement technique that uses a reverse polarized magnetic field to detect signal only from a wire, and then assigns a safety value to the configuration is disclosed in U.S. Patent Appln. No. 2010/0179763. This technique relies on analyzing artifacts in the magnitude of the image and is incapable of directly quantifying induced current, rather it detects any coupling, safe or unsafe, directly from MR signal intensity.

In another image-based technique described by Venook et al. and van den Bosch et al., artifacts in the magnitude of images are analyzed to quantify induced RF current. This method, however, requires several scans to accurately map the magnitude of the magnetic field. Furthermore, the analysis requires the manual interaction of a user to determine current from the magnitude artifact. This magnitude method of remotely measuring currents cannot be used to perform a rapid, automatic measurement using a single image.

It would therefore be desirable to provide a system and method for measuring the current induced in a conductive structure positioned in the bore of an MRI scanner using an automatic and time efficient technique. With a safe, fast and remote current measurement technique, testing experiments can be performed in a fraction of the time and several diagnostic and procedural MRI scans that are currently avoided could be carried out.

SUMMARY OF THE INVENTION

The present invention overcomes the aforementioned drawbacks by providing a method for automatically measuring currents induced on conductive structures positioned in the bore of a magnetic resonance imaging ("MRI") scanner using a single magnetic resonance image. Examples of conductive structures in which induced currents can be measured with the method of the present invention include conductive wires, metallic implants, implanted medical devices with conductive elements, patient monitoring devices, stereotactic devices, and the like.

It is thus an aspect of the invention to provide a method for using an MRI system to measure a current induced on a conductive structure by the MRI system. The MRI system is operated to acquire data from a volume-of-interest that contains at least a portion of a conductive structure using a pulse sequence that includes generating a radio frequency ("RF") field that induces a current in the conductive structure. An image that depicts the portion of the conductive structure is reconstructed from the acquired data, and a phase image is produced from the reconstructed image by extracting phase information from the reconstructed image. The phase information is then fit to a model that relates a phase of the generated RF field to a phase of a magnetic field generated by the current induced in the conductive structure. A quantitative measurement of the current induced in the conductive structure is then calculated from the fitting.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
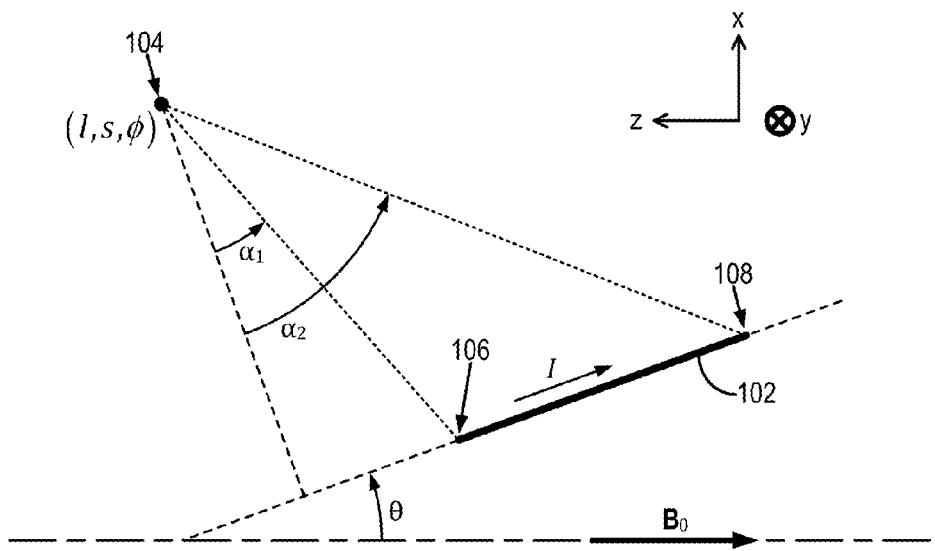
FIG. 1 is an illustration of the geometry of a length of conductive wire positioned in a bore of a magnetic resonance imaging ("MRI") system.

The present invention includes a method for measuring induced radio frequency ("RF") currents on conductive structures during a magnetic resonance imaging ("MRI") study using phase contrast MRI techniques. The induced RF current flowing on a conductive structure during an MRI scan is detected through coupling of the transmit and receive magnetic fields with the magnetic field created by the current induced in the conductive structure. This coupling results in a phase artifact in images obtained with the MRI system; thus, the images may be analyzed to quantify the magnitude and/or phase of the current flowing on the conductive structure.

By way of example, the conductive structure in which an induced current can be measured with the method of the present invention may be a conductive wire, but may also include any generally conductive structure, including implants composed of conductive materials, such as metallic hip implants; artificial heart valves; and implantable medical devices, such as implantable cardiac devices. In addition, the conductive structure may also be a device or part of a device that is outside of the subject being imaged. For instance, the conductive structure may include a patient input device, such as a keyboard that may be used in functional MRI; a patient monitoring device; a stereotactic frame; or the like. Thus, in general, the method of the present invention can be used to measure the current induced in a conductive structure, whether that conductive structure is a simple, linear wire, or whether the conductive structure is a more complex two-dimensional or three-dimensional structure. For illustrative purposes, the succeeding description is provided generally with respect to measuring the current induced in a length of conductive wire. It will be readily appreciated by those skilled in the art that the theory provided below can be readily adapted to conductive structures of arbitrary shapes. As used herein, the term "conductive" generally refers to materials that have non-zero conductivity.

With other quantitative remote current measurement techniques, long scans and manual steps are required to perform a reliable measurement. Using the phase contrast method of the present invention, however, the induced RF current can be quantified automatically using a single magnetic resonance image, thereby allowing for rapid, flexible measurements.

The method of the present invention is particularly useful for investigating the safety of medical devices in vitro during the device development phase. For instance, the method of the present invention allows for several different device configurations to be rapidly tested. The flexibility of the technique also confers the ability to quickly test device compatibility and predict a particular device's behavior under any desired MRI pulse sequence.

The method of the present invention can also be applied to assess the RF heating potential of a conductive structure inside the bore of an MRI system. This assessment of RF heating could be interleaved with clinically relevant scans. For instance, RF heating could be periodically assessed in advance of each new imaging scan. In this way, RF heating of every imaging sequence can be safely evaluated.

This RF heating assessment could be carried out automatically, with a dedicated system including both hardware and software designed to automatically assess RF heating potential. This dedicated system could be designed to automatically download images from the scanner and perform analysis. Completely independent of the user, this device could also be used to halt scanning when a dangerous situation arises, or at least to provide an alert to the clinician.

Furthermore, this technique could be applied to situations in which an RF current measurement is required other than to predict RF heating. For example, following implantation of a pacemaker, induced RF current could be evaluated to ensure proper electrical contact between the electrode and heart muscle. Furthermore, electrophysiology and ablation procedures could also benefit from ensured electrical contact through imaged-based current measurements.

A measurement of induced current on a device during a specific pulse sequence can be used to predict current, and thus heating, under any other pulse sequence. Because of this unique feature, the method of the present invention can be incorporated into a custom MRI pulse sequence that can be configured to perform a series of current measurements interleaved with clinically relevant imaging performed by a catheter device. The current measurements would be used to ensure that all relevant imaging could be performed safely. A custom sequence capable of testing safety quickly and automatically during a procedure would be applicable to a large range of procedures and would be useful for a wide variety of end users, including hospitals, research institutions, and MRI scanner manufacturers.

With reference to FIG. 1, consider a length, L of wire 102 oriented at an angle of, $\theta$, relative to the static magnetic field, $B_0$, of an MRI system. Although the wire 102 illustrated in FIG. 1 is a straight wire, the method of the present invention is also applicable to curvilinear wires and higher-dimensional structures having arbitrary shapes. The theory presented below is developed using a cylindrical reference frame centered around the wire 102 and with the height origin located at the middle of the wire 102. When current, $\tilde{I}$, is present on the wire 102, a magnetic field, $B_2$, is induced in the wire 102 vicinity according to:

$$B_2(l, s, \phi) = \frac{\mu \tilde{I}(l)}{4\pi s}(\sin(\alpha_1) - \sin(\alpha_2))\hat{\phi}; \quad (1)$$

where l, s, and $\phi$ represent the height, radial, and azimuthal coordinates of a cylindrical reference frame centered on the wire 102, respectively. In addition, $\alpha_1$ and $\alpha_2$ represent the angles formed between a point 104 at location (l,s,$\phi$) and the beginning 106 and end 108 of the wire 102, respectively. To eliminate the necessity for accurate device position information, an assumption can be made that a long length of linear conductor is present in the vicinity of the image. More specifically, it can be shown that if a length, L, of a linear conductor is present, the sine terms in Eqn. (1) can be ignored because only pixels within L/3 of the conductor are used. The induced artifacts typically have a small spatial extent, such as less than one centimeter; thus, many useful curved device configurations can be accurately investigated. Under this reasonable constraint, $B_2$ depends only on the fractional term in Eqn. (1). In this cylindrical reference frame, $B_2$ has only a tangential component; thus, $$B_2 = \tilde{B}_{2\phi}\hat{\phi} \quad (2).$$

The magnetic field, $B_2$, is linearly polarized and can therefore be described as the sum of two counter-rotating, circularly polarized fields of equal magnitude. These two fields play important and independent roles in magnetic resonance signal creation and reception. As is the convention, left-handed ("LH") fields will be denoted with a superscript "+" and right-handed ("RH") fields will be denoted with a superscript "−".

The LH field of the linear current distribution will add to the LH component of the transmit coil magnetic field. The total LH transverse RF magnetic field responsible for excitation is, therefore $$B^+(r) = B_1^+ + B_2^+ \quad (3).$$

With the goal of calculating the distribution of $B_2$, the principle of reciprocity can be used to relate components of the RF field in the cylindrical frame to components in the rectangular lab frame. Following this manipulation:

$$\tilde{B}_{2\phi}^+ = \tfrac{1}{2}(\tilde{B}_{2\phi} + j\tilde{B}_{1,\phi}) = \tfrac{1}{2}\tilde{B}_{2\phi}(-\sin\phi + j\cos\phi) \quad (4);$$

where $\tilde{B}_{2,x}$ and $\tilde{B}_{2,y}$ represent $\tilde{B}_{2\phi}$ projected onto the x-axis and the y-axis, respectively. Eqn. (4) can be simplified as, $$\tilde{B}_{2\phi}^+ = \frac{j}{2}\cdot \tilde{B}_{2\phi}(\cos\phi + j\cdot\sin\phi) = \frac{j}{2}\cdot \tilde{B}_{2\phi}\cdot e^{j\phi}; \quad (5)$$

and thus, $$\tilde{B}_{tot}^+ = B_1^+ \cdot e^{j\varphi_1^+} + \frac{j}{2}\cdot B_{2\phi}\cdot e^{j(\varphi_2^+ + \phi)}; \quad (6)$$

where $\phi_1$ and $\phi_2$ represent the phase of the transmit coil and conductive structure RF field, respectively. It can be similarly shown that the total RH component of the RF magnetic field is given by:

$$\tilde{B}_{tot}^- = B_1^- \cdot e^{j\varphi_1^-} + \frac{j}{2}\cdot B_{2\phi}\cdot e^{j(\phi - \varphi_2^-)}. \quad (7)$$

The quantities $\phi_2^+$ and $\phi_2^-$ are independent of reference frame and thus the "+/−" superscripts are unnecessary. The quantity $\phi_2^{+/-}$ represents the phase of the current, $\tilde{I}$, at the image location. On the other hand, the quantity $\phi_1^{+/-}$ represents the phase of the transmit or receive field, respectively, that is produced by whichever coil is in use. In general, $\phi_1^+ \neq \phi_1^-$ and thus these variables are treated as distinct. Furthermore, it can be shown that in an isotropic, homogeneous medium, $B_1^+ = B_1^- = B_1$.

According to the principle of reciprocity, and under the assumption of a small applied flip angle, the total received signal, $\xi$, is given by the following:

$$\xi \approx -2j\omega\gamma\tau \tilde{I}_c M_0(\tilde{B}_{tot}^+ (\tilde{B}_{tot}^-)^+) \quad (8);$$

where $\gamma$ is the gyromagnetic ratio; $\tau$ is the duration of the $B_1$ pulse; and $M_0$ is the equilibrium longitudinal magnetization prior to excitation. Eqn. (8) can be expanded as follows:

$$\xi \approx \quad (9)$$
$$-2j\omega\gamma\tau \tilde{I}_c M_0\left(B_1 \cdot e^{j\varphi_1^+} + \frac{jB_{2\phi}}{2}e^{j(\varphi_2 + \phi)}\right)\cdot \left(B_1 \cdot e^{-j\varphi_1^-} - \frac{jB_{2\phi}}{2}e^{j(\varphi_2 - \phi)}\right).$$

Given the expression above, it can be shown that the phase of the magnet resonance signal, $\xi$, can be expressed as follows:

$$\angle \xi = f\left(\frac{B_1}{B_{2\phi}}, \varphi_1^+, \varphi_1^-, \varphi_2, \phi, s\right) + \angle \tilde{I}_c; \quad (10)$$

where $f = \angle(\tilde{B}_{tot}^+ \cdot (\tilde{B}_{tot}^-)^+)$. The quantities $\phi$ and s depend only on the wire position in the image, and thus the dependency of signal phase on these parameters can be written as a dependence on the wire location, $(x_w, y_w)$, in the image:

$$\angle \xi = f\left(\frac{B_1}{B_{2\phi}}, \varphi_1^+, \varphi_1^-, \varphi_2, x_w, y_w\right) + \angle \tilde{I}_c. \quad (11)$$

In order to determine the current magnitude using Eqn. (11), the signal phase, $B_{2\phi}$, and $\phi_2$ must be determined. This can be achieved by fitting f to an acquired phase image. Modulating $\phi_1^+$ and $\phi_1^-$ together results in the same offset effect on f as modulating $\angle \tilde{I}_c$ has on $\angle \xi$; thus, the discrepancy between f and $\angle \xi$ will manifest as erroneous values for $\phi_1^+$ and $\phi_1^-$ returned by the fitting algorithm. Fitting to f is less computationally intensive than fitting to $\angle \xi$, as the former fit can be performed with only six degrees of freedom whereas the latter requires seven. The erroneous $\phi_1^+$ and $\phi_1^-$ values will therefore be tolerated because these values are not used in calculating $\tilde{I}$.

In order to measure current at the location of each image, analysis can be performed on the measured phase image using Eqn. (11). To determine current, the $B_1$ field in the vicinity of the conductive structure and the position of the conductive structure in the image must be known.

One method of determining $B_1$ phase near the conductive structure is to first apply a mask to exclude any pixels associated with or near the conductive structure and then analyze the remaining phase distribution after masking, which would include only the background phase. This distribution can then be interpolated near the conductive structure. To analyze the background phase distribution, a functional form can be chosen to approximate the distribution and a fit can be performed. A direct interpolation that does not begin with a fitting step, such as a linear or spline fit, could also be performed. By way of example, a second order two-dimensional function can be fitted to the background phase distribution and then extrapolated across the RF artifact region during fitting.

The transmit magnetic field magnitude can be determined using the nominal flip angle prescribed by the MRI system. The duration of the transmit magnetic field can be measured directly by downloading the sequence waveform from the MRI system, and the flip angle can be used to calculate the magnitude.

One method for determining the conductive structure position in the image is a manual identification. In a magnitude image, the conductive structure can be identified by the location of maximum signal. The conductive structure position in the image could also be determined automatically. For instance, a mask could be applied to exclude points far from the conductive structure and a maximum intensity projection could then be used to determine the conductive structure location automatically. By way of example, the conductive structure location can be determined automatically by including it is a fit parameter in the fit to Eqn. (11).

Figure 2:
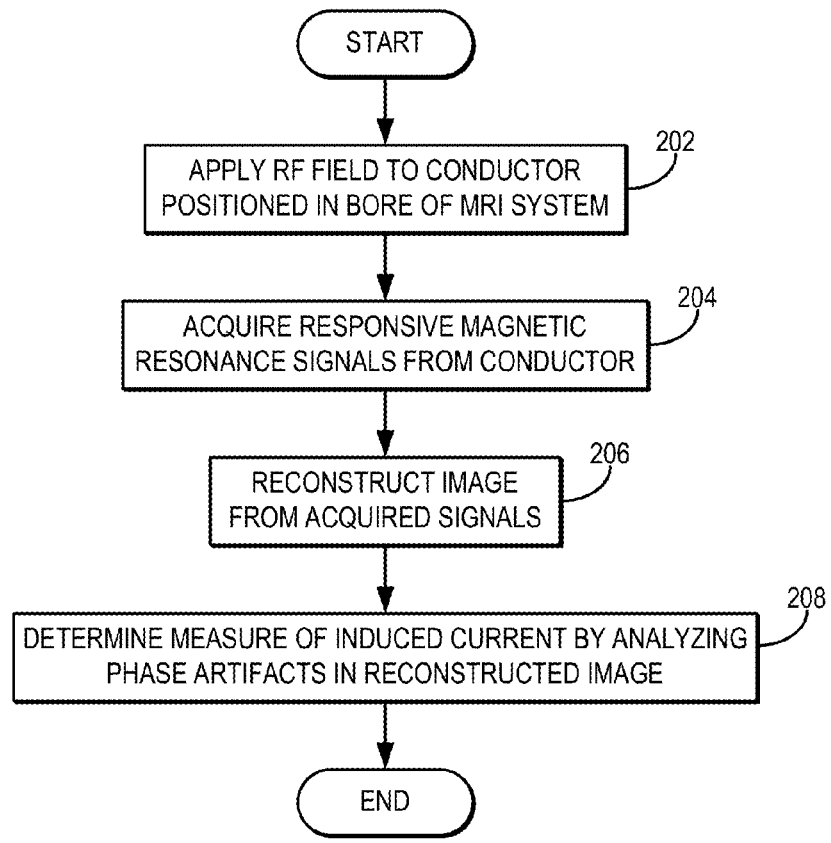
FIG. 2 is a flowchart setting forth the steps of an example of a method for measuring the magnitude and/or phase of a current induced in a conductor, such as a conductive structure, using an MRI system.

Referring now to FIG. 2, a flowchart setting forth the steps of an example of a method for measuring the magnitude and/or phase of a current induced in a conductor, such as a conductive structure, using an MRI system is illustrated. The method begins with generally inducing a current in the conductor by applying an RF field to the conductor while it is positioned in a bore of the MRI system, as illustrated at step 202. Next, magnetic resonance signals are acquired from the conductor using the MRI system, as indicated at step 204. An image that depicts the conductor is reconstructed from the acquired signals, as indicated at step 206. This image includes phase artifacts that are generated by the coupling of the magnetic field produced by the induced current with the applied RF field. Thus, in some applications an image that depicts only phase information may be produced from the reconstructed image to facilitate the analysis of the phase artifacts. A measurement of the magnitude and/or phase of the induced current is then determined by analyzing the phase artifacts in the reconstructed image, as indicated at step 208. As discussed above, the measurement of the magnitude or phase of the induced current can be determined by fitting phase information to an analytical model, such as the model, f, represented in Eqn. (11). Alternatively, the magnitude or phase of the induced current can be determined by fitting phase information to a model generated by a computational electromagnetic technique or other simulation technique. By way of example, such a model can be generated using a method of moments ("MoM") technique, a finite elements method ("FEM"), a finite integration technique ("FIT"), or the like. The magnitude or phase of the induced current can also be determined by directly solving Eqn. (11). To do this, however, values or estimations of the parameters relied upon in Eqn. (11) must be known or made. When a direct computation can be made using Eqn. (11), that computation can be made on a pixel-by-pixel basis.

Figure 3A:
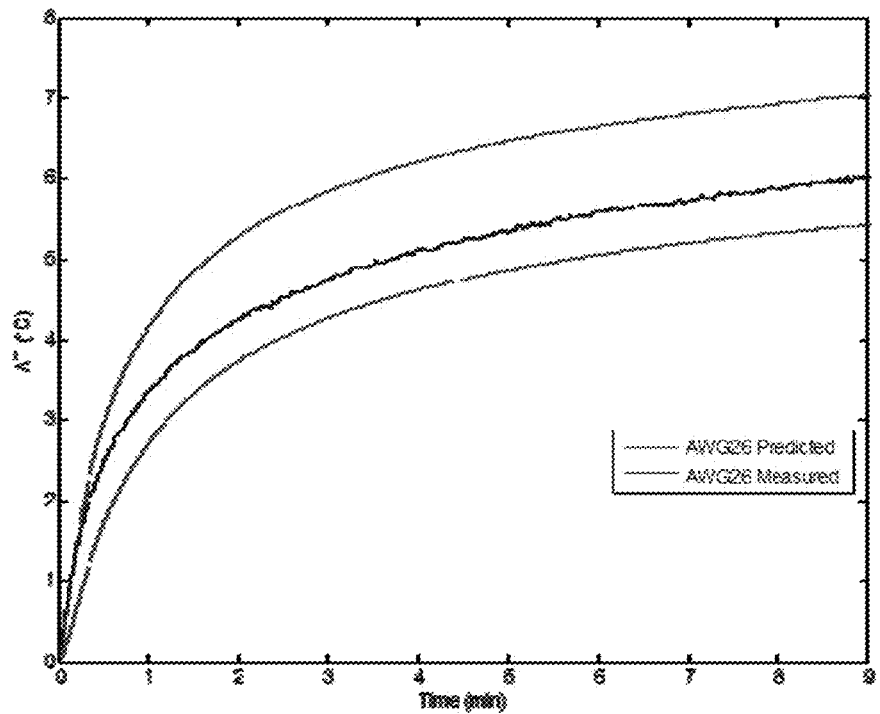
FIG. 3A is an example plot of a temperature rise in a conductive wire caused by an induced current.
Figure 3B:
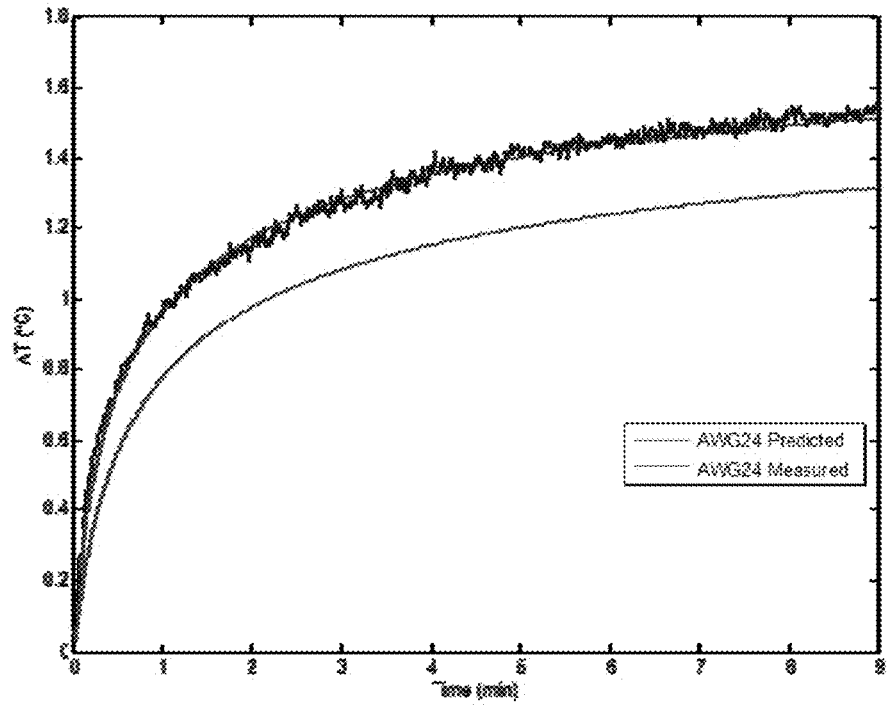
FIG. 3B is another example plot of a temperature rise in a conductive wire caused by an induced current.

One application of the method of the present invention is to predict the heating behavior of a certain configuration using safely acquired measurements. The ability of the method of the present invention to achieve this goal is illustrated in FIGS. 3A and 3B, which display measured temperature rise in different wires during the performance of an MRI pulse sequence. FIG. 3A illustrates measured and predicted temperature rises in a AWG 26 copper wire seen during the performance of an example MRI pulse sequence, such as an RF-spoiled gradient echo pulse sequence. The highest and lowest theoretical temperature rises are represented by the upper and lower lines in FIG. 3A. FIG. 3B illustrates measured and predicted temperature rises in a AWG 24 copper wire seen during the performance of an example MRI pulse sequence. Like FIG. 3A, the upper and lower lines in FIG. 3B represent the highest and lowest theoretical temperature rises.

No temperature rise was detected during current measurement scans. The theory used to predict heating given a RF current distribution, namely Maxwell's equations and Pennes' bioheat equation, is well established; thus, agreement between measured and predicted RF heating, as seen in FIGS. 3A and 3B, is sufficient to conclude that accurate current measurements can be obtained. It has thus been demonstrated through experiment that the method of the present invention is capable of safely and quickly assessing the RF heating potential of a certain device, and predicting heating behavior under application of other sequences.

The method of the present invention allows RF currents induced on conductive structures positioned within the bore of an MRI scanner to be quantified quickly by performing analysis on a single phase image and requires no manual steps. The phase image can be acquired quickly using an unmodified MRI pulse sequence and no hardware modifications.

Figure 4:
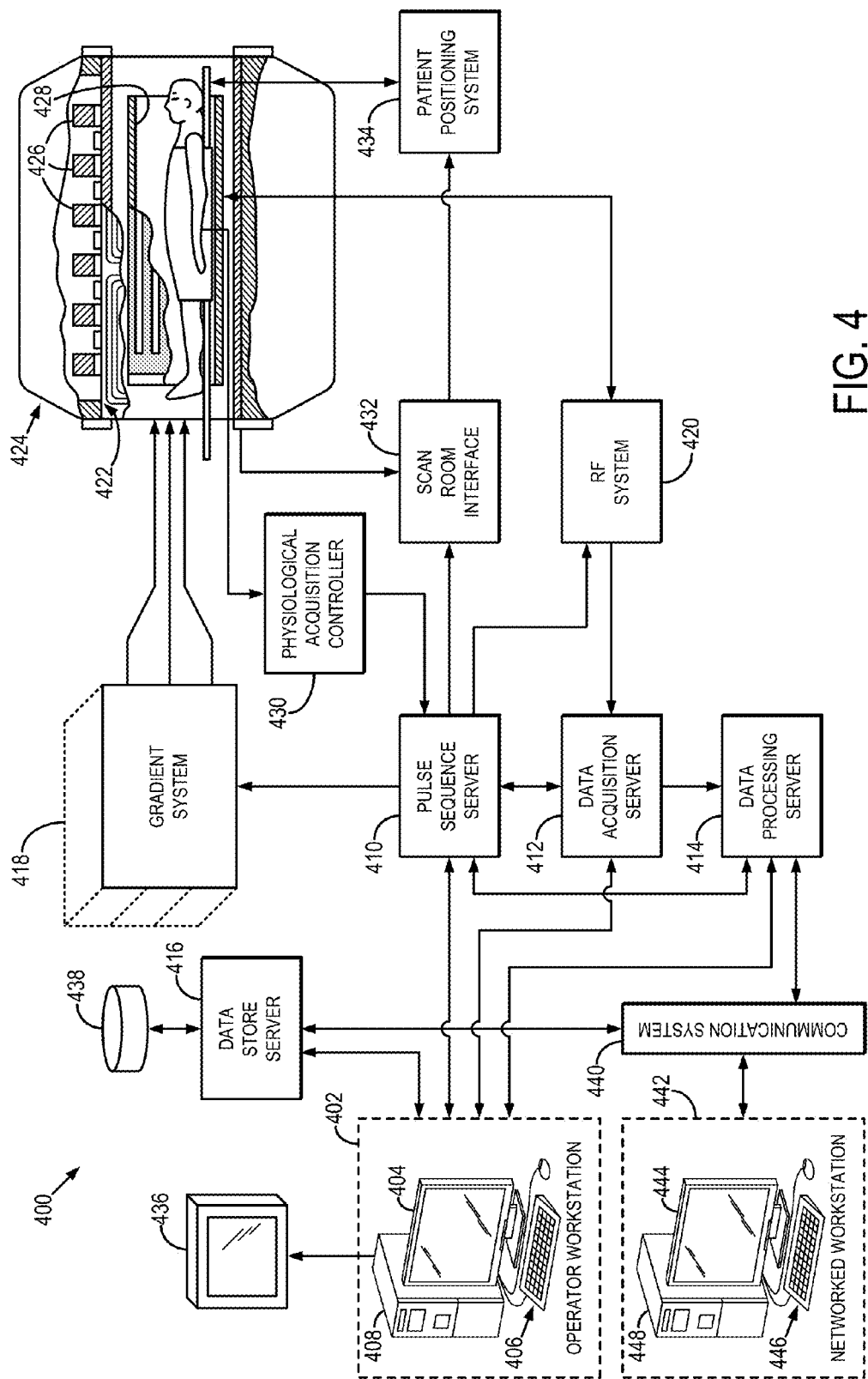
FIG. 4 is a block diagram of an example of an MRI system that may be used to implement the method of the present invention.

Referring particularly now to FIG. 4, an example of a magnetic resonance imaging ("MRI") system 400 is illustrated. The MRI system 400 includes an operator workstation 402, which will typically include a display 404; one or more input devices 406, such as a keyboard and mouse; and a processor 408. The processor 408 may include a commercially available programmable machine running a commercially available operating system. The operator workstation 402 provides the operator interface that enables scan prescriptions to be entered into the MRI system 400. In general, the operator workstation 402 may be coupled to four servers: a pulse sequence server 410; a data acquisition server 412; a data processing server 414; and a data store server 416. The operator workstation 402 and each server 410, 412, 414, and 416 are connected to communicate with each other. For example, the servers 410, 412, 414, and 416 may be connected via a communication system 440, which may include any suitable network connection, whether wired, wireless, or a combination of both. As an example, the communication system 440 may include both proprietary or dedicated networks, as well as open networks, such as the internet.

The pulse sequence server 410 functions in response to instructions downloaded from the operator workstation 402 to operate a gradient system 418 and a radiofrequency ("RF") system 420. Gradient waveforms necessary to perform the prescribed scan are produced and applied to the gradient system 418, which excites gradient coils in an assembly 422 to produce the magnetic field gradients $G_x$, $G_y$, and $G_z$ used for position encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil (not shown in FIG. 4), in order to perform the prescribed magnetic resonance pulse sequence. Responsive magnetic resonance signals detected by the RF coil 428, or a separate local coil (not shown in FIG. 4), are received by the RF system 420, where they are amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the scan prescription and direction from the pulse sequence server 410 to produce RF pulses of the desired frequency, phase, and pulse amplitude waveform. The generated RF pulses may be applied to the whole-body RF coil 428 or to one or more local coils or coil arrays (not shown in FIG. 4).

The RF system 420 also includes one or more RF receiver channels. Each RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \tag{12}$$

and the phase of the received magnetic resonance signal may also be determined according to the following relationship:

$$\varphi = \tan^{-1}\left(\frac{Q}{I}\right). \tag{13}$$

The pulse sequence server 410 also optionally receives patient data from a physiological acquisition controller 430. By way of example, the physiological acquisition controller 430 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 410 to synchronize, or "gate," the performance of the scan with the subject's heart beat or respiration.

The pulse sequence server 410 also connects to a scan room interface circuit 432 that receives signals from various sensors associated with the condition of the patient and the magnet system. It is also through the scan room interface circuit 432 that a patient positioning system 434 receives commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, such that no data is lost by data overrun. In some scans, the data acquisition server 412 does little more than pass the acquired magnetic resonance data to the data processor server 414. However, in scans that require information derived from acquired magnetic resonance data to control the further performance of the scan, the data acquisition server 412 is programmed to produce such information and convey it to the pulse sequence server 410. For example, during prescans, magnetic resonance data is acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also be employed to process magnetic resonance signals used to detect the arrival of a contrast agent in a magnetic resonance angiography ("MRA") scan. By way of example, the data acquisition server 412 acquires magnetic resonance data and processes it in real-time to produce information that is used to control the scan.

The data processing server 414 receives magnetic resonance data from the data acquisition server 412 and processes it in accordance with instructions downloaded from the operator workstation 402. Such processing may, for example, include one or more of the following: reconstructing two-dimensional or three-dimensional images by performing a Fourier transformation of raw k-space data; performing other image reconstruction algorithms, such as iterative or back-projection reconstruction algorithms; applying filters to raw k-space data or to reconstructed images; generating functional magnetic resonance images; calculating motion or flow images; and so on.

Images reconstructed by the data processing server 414 are conveyed back to the operator workstation 402 where they are stored. Real-time images are stored in a data base memory cache (not shown in FIG. 4), from which they may be output to operator display 412 or a display 436 that is located near the magnet assembly 424 for use by attending physicians. Batch mode images or selected real time images are stored in a host database on disc storage 438. When such images have been reconstructed and transferred to storage, the data processing server 414 notifies the data store server 416 on the operator workstation 402. The operator workstation 402 may be used by an operator to archive the images, produce films, or send the images via a network to other facilities.

The MRI system 400 may also include one or more networked workstations 442. By way of example, a networked workstation 442 may include a display 444; one or more input devices 446, such as a keyboard and mouse; and a processor 448. The networked workstation 442 may be located within the same facility as the operator workstation 402, or in a different facility, such as a different healthcare institution or clinic.

The networked workstation 442, whether within the same facility or in a different facility as the operator workstation 402, may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may exchanged between the data processing server 414 or the data store server 416 and the networked workstations 442, such that the data or images may be remotely processed by a networked workstation 442. This data may be exchanged in any suitable format, such as in accordance with the transmission control protocol ("TCP"), the internet protocol ("IP"), or other known or suitable protocols.

A method for automatically measuring RF currents induced on conductive structures positioned in the bore of an MRI scanner using a single magnetic resonance image has been provided. The method can be generally summarized as follows. A conductive structure is positioned within the bore of an MRI scanner during imaging. When the MRI system is transmitting an RF field, a current is induced in the conductive structure. The current creates a magnetic field at the Larmor frequency, which couples to the RF magnetic field in the vicinity of the conductive structure. The modified magnetic field results in an artifact being generated in phase images.

The artifact in the phase image is then analyzed to determine the current induced in the conductive structure.

The method of the present invention offers significant advantages over existing remote current measurement techniques. Some advantages include that no modification of any hardware is required and that a quantitative current measurement can be obtained automatically using a single, relatively low-power image.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for using a magnetic resonance imaging ("MRI") system to measure a current induced on a conductive structure by the MRI system, the steps of the method comprising:
   a) acquiring with the MRI system, data from a volume-of-interest that contains at least a portion of a conductive structure using a pulse sequence that includes generating a radio frequency (RF) field that induces a current in the conductive structure;
   b) reconstructing from the data acquired in step a), an image that depicts the portion of the conductive structure;
   c) producing a phase image from the image reconstructed in step b) by extracting phase information from the reconstructed image;
   d) fitting the phase information in the phase image to a model that relates a phase of the generated RF field to a phase of a magnetic field generated by the current induced in the conductive structure; and
   e) determining a quantitative measurement of the current induced in the conductive structure from the fitting performed in step d).

2. The method as recited in claim 1 in which the model used in step d) describes coupling between the generated RF field and the magnetic field generated by the induced current.

3. The method as recited in claim 2 in which the model used in step d) describes coupling between left-handed circularly polarized components of the generated RF field and the magnetic field generated by the induced current, and right-handed circularly polarized components of the generated RF field and the magnetic field generated by the induced current.

4. The method as recited in claim 2 in which step d) includes computing a phase and a magnitude of the RF field generated in step a) and including the computed phase and magnitude values in the model.

5. The method as recited in claim 4 in which the phase of the RF field generated in step a) is computed by:
   determining a background phase distribution by masking values in the phase image produced in step c) that are associated with and within a defined distance from the conductive structure; and
   computing the phase of the RF field by interpolating the background phase distribution.

6. The method as recited in claim 5 in which the background phase distribution is interpolated by fitting the non-masked phase values to a functional form.

7. The method as recited in claim 6 in which the functional is a second order two-dimensional function.

8. The method as recited in claim 5 in which the background phase distribution is interpolated using a direct interpolation.

9. The method as recited in claim 8 in which the direct interpolation includes at least one of a linear interpolation and a spline interpolation.

10. The method as recited in claim 4 in which the magnitude of the RF field is determined from RF waveform parameters stored on the MRI system.

11. The method as recited in claim 2 in which step d) includes determining a location of the conductive structure in the phase image and including the determined location in the model.

12. The method as recited in claim 11 in which the location of the conductive structure is determined automatically by:
    masking locations in the phase image that are far from an estimated position of the conductive structure; and
    performing a maximum intensity projection on the masked magnitude image to determine the location of the conductive structure.

13. The method as recited in claim 1 in which step e) includes determining the quantitative measurement of the current using an equation that relates a phase of the induced current, the fitting performed in step d), and the phase information in the phase image produced in step c).

14. The method as recited in claim 1 in which the conductive structure is at least one of a one-dimensional conductive element, a two-dimensional conductive element, and a three-dimensional conductive element.

15. The method as recited in claim 1 in which the conductive structure forms a part of an electronic device.

16. The method as recited in claim 1 in which the conductive structure is at least one of an implanted medical device and a prosthetic implant.

17. A method for measuring a current induced in a conductive structure by a radio frequency (RF) field generated by a magnetic resonance imaging (MRI) system, the steps of the method comprising:
    a) acquiring data from a conductive structure with an MRI system using a pulse sequence that includes generating an RF field that induces a current in the conductive structure;
    b) reconstructing an image from the data acquired in step a);
    c) calculating a quantitative measurement of the current induced in the conductive structure by fitting a phase value in the image reconstructed in step b), a phase value of the induced current, and a phase value of a magnetic field generated by the induced current, to a model.

18. The method as recited in claim 17 in which the model used in step c) describes coupling between the RF field generated in step a) and the magnetic field generated by the induced current.

19. A method for measuring a current induced in a conductor by a radio frequency (RF) field generated by a magnetic resonance imaging (MRI) system, the steps of the method comprising:
    a) directing the MRI system to generate an RF field that induces a current in a conductor positioned in the MRI system;
    b) acquiring magnetic resonance signals from the conductor using the MRI system after the RF field is generated in step a);
    c) reconstructing an image from the magnetic resonance signals acquired in step b);
    d) producing a phase image from the image reconstructed in step c), the phase image depicting a phase artifact that is indicative of a coupling of the RF field generated in step a) with a magnetic field generated by the current induced in the conductor;

e) determining a quantitative measurement of the current induced in the conductor by analyzing the phase artifact depicted in the phase image produced in step d).

20. The method as recited in claim 19 in which step e) includes fitting phase values associated with the phase artifact to a model that relates a phase of the RF field generated in step a) to a phase of the magnetic field generated by the current induced in the conductor.

21. The method as recited in claim 19 in which the model used in step e) is generated using a computational electromagnetic modeling technique.

22. The method as recited in claim 21 in which the computational electromagnetic modeling technique includes at least one of a method of moments technique, a finite elements method, and a finite integration technique.

23. The method as recited in claim 19 in which step e) includes directly computing the quantitative measurement of the current using a phase of the magnetic resonance signals acquired in step b), a phase of the RF field generated in step a), and a phase of the magnetic field generated by the induced current.

* * * * *